United States Patent [19]

Yokota

[11] Patent Number: 4,943,767
[45] Date of Patent: Jul. 24, 1990

[54] AUTOMATIC WAFER POSITION ALIGNING METHOD FOR WAFER PROBER

[75] Inventor: Keiichi Yokota, Nirasaki, Japan

[73] Assignee: Tokyo Electron Limited, Tokyo, Japan

[21] Appl. No.: 316,142

[22] Filed: Feb. 27, 1989

[30] Foreign Application Priority Data

Aug. 21, 1986 [JP] Japan .................. 61-193967

[51] Int. Cl.$^5$ .................. G01R 31/02; H04N 7/18
[52] U.S. Cl. .............. 324/158 F; 324/158 P; 358/101
[58] Field of Search .......... 324/158 F, 158 P, 73 PC; 358/101

[56] References Cited

U.S. PATENT DOCUMENTS 4,677,474 6/1987 Sato et al. .................. 358/101

FOREIGN PATENT DOCUMENTS

58-169922 10/1983 Japan .
59-44841 3/1984 Japan .
60-24029 2/1985 Japan .
62-16018 1/1987 Japan .

Primary Examiner—Ernest F. Karlsen
Attorney, Agent, or Firm—Oblon, Spivak, McClelland, Maier & Neustadt

[57] ABSTRACT

An automatic alignment method of the position of the probe tips and electric pads of wafer comprises the steps of recognizing and filing the position data of the pads of a new sort wafer and correction amount data between the position of the electrode pads and the probe tips equipped actually with the probe, determining and filing not less than 2 positions of electrode pads for an $\theta$ alignment of probe, detecting and outputting a height level data of a position of a dummy wafer, forming probe mark, detecting and outputting the positions, in X-, Y-axes, and $\theta$ direction offset between pads and tips, correcting these offset, repeated these check steps, saving final correction data, and using these data for aligning an actual wafer.

5 Claims, 6 Drawing Sheets

F I G. 4A  (Z UPWARD MOVEMENT)

(PROBE TIP CONTACT STATE)

F I G. 4B (Z UPWARD MOVEMENT
BY OVERDRIVE AMOUNT)

AUTOMATIC WAFER POSITION ALIGNING METHOD FOR WAFER PROBER

BACKGROUND OF THE INVENTION

1. Field of the Invention

The present invention relates to a wafer prober for measuring a semiconductor chip in a semiconductor wafer and, more particularly, to a method of automating a probe aligning operation of a probe card.

2. Description of the Related Art

In a recent semiconductor manufacturing process, the operations performed by the wafer prober and the like have been automated in order to make the manufacturing process more efficient, and to improve the yield and quality of the finished product.

With the increase in the packing density of semiconductor chips, a wafer prober is now required to carry out measurements in relation to small lots of wafers of various sorts, and for this reason, its operation needs to be fully automated.

The present applicant proposes a prober which can automatically change probe cards as the sort of wafer to be measured changes.

Japanese Patent Disclosure (Kokai) No. 62-169341 discloses a prober in which a probe card member—a combination of a probe card and a protection plate—is automatically changed in correspondence with a change in the sort of wafer to be measured, while Japanese Patent Disclosure (Kokai) No. 62-263647 discloses a prober in which a ring insert with a probe card or the like assembled therein is automatically changed as the sort of wafer to be measured changes.

Each of the above-mentioned probers allow automatic changing of probe cards; however, a fully automated semiconductor manufacturing system cannot be achieved unless the probe aligning operation is automated along with the automatic changing of probe cards.

SUMMARY OF THE INVENTION

It is an object of the present invention to provide a wafer prober which can realize both automatic changing of probe cards and automated probe alignment of a probe card, in correspondence with a change in the sort of wafer to be measured.

BRIEF DESCRIPTION OF THE DRAWINGS

FIG. 5 is a flow chart for explaining an automated probe aligning operation.

DETAILED DESCRIPTION OF THE PREFERRED EMBODIMENTS

An embodiment of the present invention will now be described, with reference to FIGS. 1 to 6.

Figure 1:
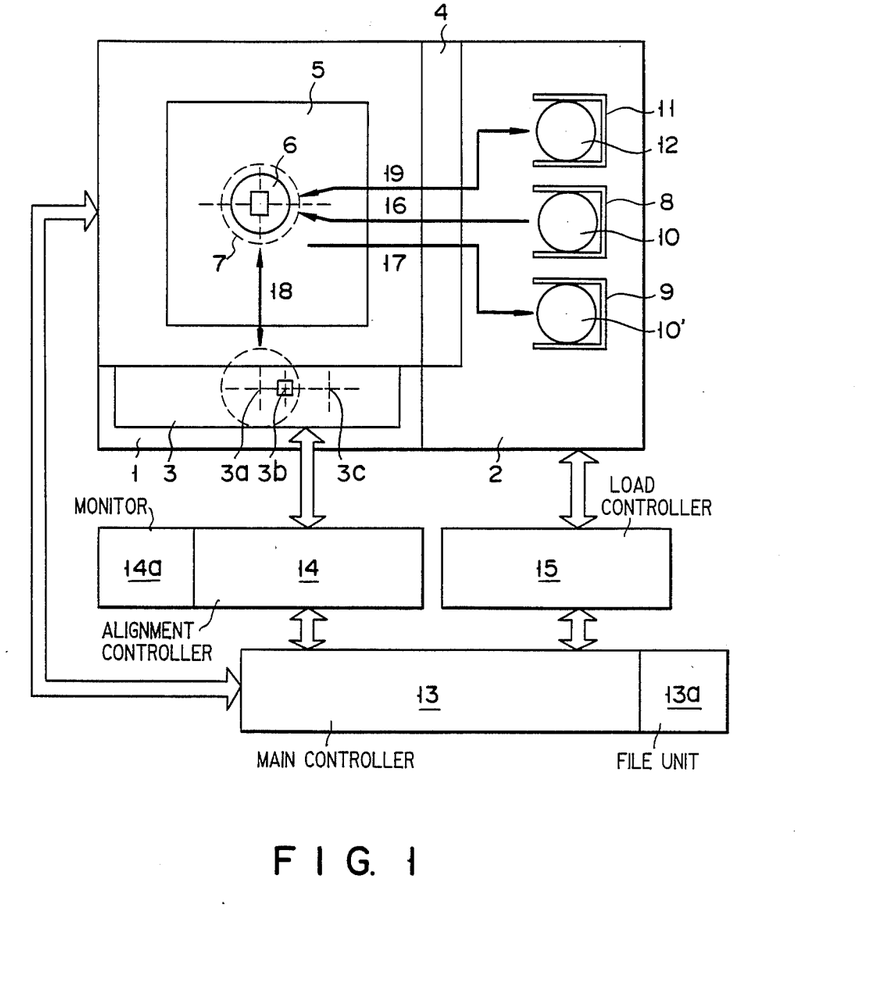
FIG. 1 is a schematic plan view for explaining the present invention.

In FIG. 1, reference numeral 1 denotes a main stage of a wafer prober; 2, a loader unit of the wafer prober; 3, an alignment bridge; and 4, a wafer handling unit located between a loader stage and the main stage.

The loader unit 2 includes a structure in which a number of wafer cassettes can be placed; more precisely, a sender cassette 8 for storing unmeasured wafers 10, a receiver cassette 9 for storing measured wafers 10', and a dummy wafer cassette 11 for storing dummy wafers 12 are all arranged thereon. An unmeasured wafer 10 is loaded onto a chuck top 7 of the main stage 1 by the handling unit 4, moving along a route 16, a measured wafer 10' is stored in the receiver cassette 9 by the handling unit 4, moving along a route 17, while a dummy wafer 12 is moved between the dummy wafer cassette 11 and the main stage along a route 19. A head plate 5 for setting a probe card 6 is arranged on the main stage 1. By the head plate 5 and a holding mechanism of the probe card 6, a prober card can be automatically exchanged in accordance with an automatic exchange mode of the probe card as described above in correspondence with the sort of wafer.

A mechanism is formed in the main stage 1 for driving the chuck top 7 with a wafer thereon arranged on the main stage 1 in the X-, Y-, and Z-axes directions. The alignment bridge 3, arranged in the stage, for performing a $\theta$ alignment has an optical beam radiation unit 3a and a camera unit 3b. On the bridge 3 a probe mark of the probe card is detected by utilizing these units, and the height level of the wafer surface is also detected by using an electric capacitive sensor 3c. The measured wafer is conveyed back into the cassette. In combination with these above detection mechanisms, an alignment controller 14 for processing alignment data (optical position data), a loader controller 15 for controlling the loader stage, and a main controller 13 for controlling the main stage are arranged. Of these controllers, the main controller 13 processes the data from the other controllers 14 and 15. Reference numeral 13a denotes a file unit.

Figure 2:
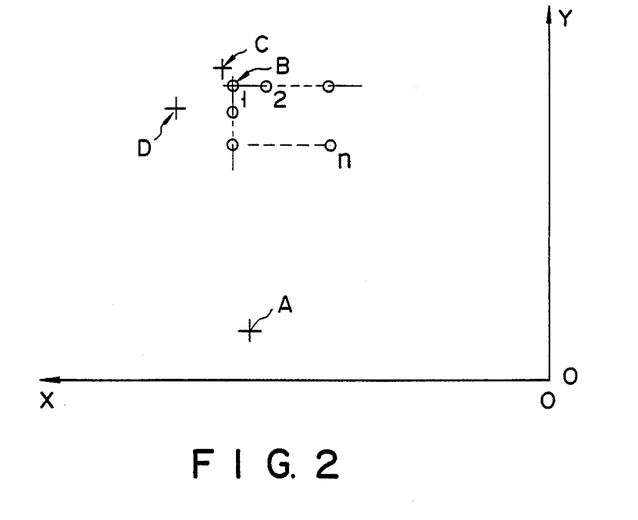
FIG. 2 is a coordinate chart on an X-Y plane of a main stage.

FIG. 2 shows coordinates of main points, e.g., electrode pad positions of a wafer on the main stage 1, a probe card position, a beam position, and the like, necessary for automatic alignment of a wafer position. A point A indicates a beam position for detecting a probe mark, and its coordinates are represented by XA and YA. A point B indicates a position of a probe card corresponding to a sort of wafer used in an initially tested lot, as a standard probe tip position, and is assumed to be an upper left probe position of probes of a probe card. The coordinates of the point B are represented by XB1 and YB1. The coordinates XB1 and YB1 are incremental coordinates with respect to the point A. Similarly, incremental coordinates of probes B2, B3, . . . , Bn other than B1 of the probe card, with respect to the point A are represented by XB2, YB2, XB3, YB3, . . . , XBn and YBn. These coordinates represent the reference positions on data where a probe card is to be set corresponding to the sort of wafer.

Thereafter, when the same type of lot is tested, a position of a probe card setting up the prober renewedly is given by a point C. At the point C, an upper left probe position of probes of the probe card is represented by C1, and incremental coordinates with respect to the point A are represented by XC1 and YC1, in the same manner as the point B.

Since the point C often does not coincide with the point B, a difference therebetween must be corrected as will be described below.

The $\theta$ alignment of the wafer is executed by detecting features on the device pattern without decting the positions of electrode pads on the wafer. Thus, even if a wafer is moved below a probe card after the $\theta$ alignment, the pads do not normally coincide with the probe tips of the probe card. It then needed to cause pad positions of chips on the wafer to coincide with the probe tip positions on the probe card when the known type wafer is tested renewedly. Similarly its coincidence is needed when the probe card is changed because of the variety of the probe card position.

Figure 3:
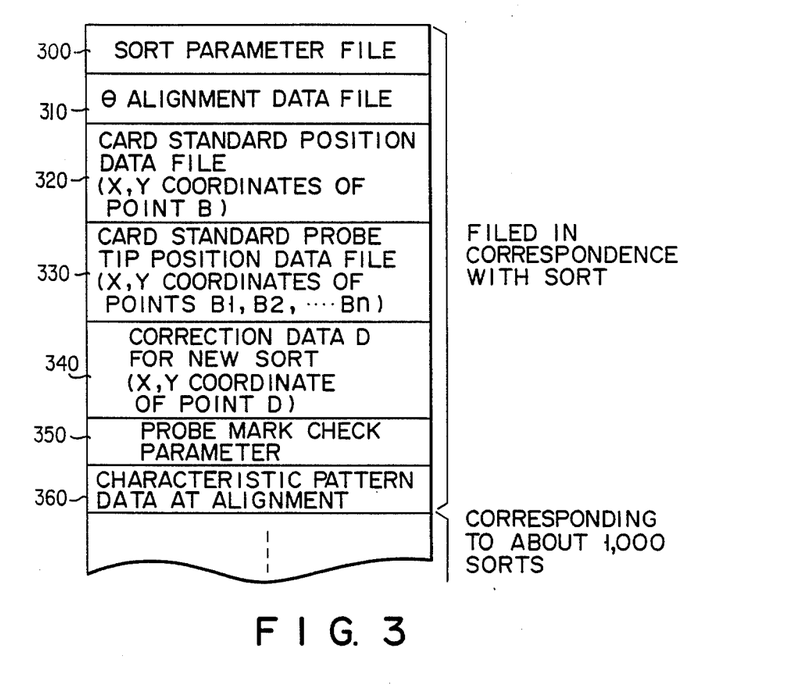
FIG. 3 is a file chart in a main controller.

When a new sort of wafer is tested for the first time, $\theta$ alignment of the wafer is performed in accordance with the predetermined sort parameters for a new type wafer, and the wafer is moved below the standard probe tip position after detecting the features on the device pattern. The probe tip positions of the probe card are represented by B and the pad positions of the wafer chip are represented by D. The difference between the point B and the point D is the amount of amendment ($\overrightarrow{XDB}$, $\overrightarrow{YDB}$). Thereafter, when the same lot is tested, the position of the point D does not vary, because its alignment is performed by using the characteristic pattern data of the lot testing for the first time. But the amount of amendment with respect to the probe card tip point C ($\overrightarrow{XDC}$, $\overrightarrow{YDC}$) will vary because the probe card is mounted renewedly on the prober. FIG. 3 is a file chart of the main controller, and a floppy disk unit is used. Data are filed to have a wafer sort name as a directory, and can be applied in correspondence with the number of sorts used. Of these data, a sort parameter file 300 and $\theta$ alignment data file 310 are used in a conventional wafer prober. The probe card standard position B data file 320, standard probe tip positions data file 330 B1, B2, . . . , Bn of the probe card, the correction data ($\overrightarrow{XDB}$, $\overrightarrow{YDB}$) for a new sort lot 340, a probe mark check parameter 350, and the characteristic pattern data at alignment 360 are file data newly added in the present invention. These data correspond to the coordinates chart shown in FIG. 2, and are used for automated alignment, as will be described below. That is, these are used for $\theta$ alignment of the probe card and alignment of probe tip position.

When a new sort of wafer is set to prober for testing, a probe card 6 corresponding to the sort of wafer is set. A means above mentioned is disclosed in Japanese Patent Disclosure (Kokai) No. 62-169341 or Japanese Patent Disclosure (Kokai) No. 62-263647. A sort parameter for the new sort is loaded from its directory file, and the wafer 10 is loaded onto the main chuck top 7 along the route 16. After the $\theta$ alignment of the wafer, the central pad position of a wafer chip moved below the probe card corresponds to the point D. An operator then manually corrects the pad position of the wafer at the point D to coincide with the probe tip position B of the probe card. The wafer 10 is moved to the beam position A and is displayed on a monitor 14a. The pad center of the wafer is caused to coincide with a cross point on the main stage corresponding to the beam position to recognize the point B of the probe card position, and the coordinates are stored in the file unit 13a. These coordinates are standard position coordinates $XB1$ and $YB1$ of the probe card. The correction data ($XDB$, $YDB$) is then filed.

Each pad is then moved to the cross point while observing the monitor 14a to recognize the position coordinates of each pad. These pad positions reveal the standard probe tip positions $XB1$, $YB1$, $XB2$, $YB2$, . . . , $XBn$ and $YBn$ of the probe card corresponding to the new sort of wafer. These points need to adopt more than 2 points for knowing the $\theta$ heel of the probe card. Thereafter these pads (at least 2 pads) are filed as a recognition pad at $\theta$ alignment of probe card. These coordinate positions are stored in the file unit 13a. The wafer 10 is then stored in the sender cassette along the route 16. With the above operation, the standard probe tip position data file for the new sort of wafer can be obtained.

The dummy wafer 12 is loaded onto the main chuck top 7 from the cassette 11, and the Z level of surface of the dummy wafer 12 is detected by the detection mechanisms such as a height sensor. Thereafter, the dummy wafer 12 is moved to a measurement unit below the probe card 6, and the Z axis of the main stage 1 is drive-controlled to form a probe mark. Then, this probe card position is given by the point C. Note that the dummy wafer is subjected to a surface treatment to facilitate easy probe mark formation, and is formed of a soft material such as aluminum.

Z-axis control for forming the probe mark is performed as follows. A tester is started simultaneously with an upward movement of the main stage 1 in the Z-axis direction, it is confirmed that the the wafer in a probe tip contacts the wafer in a probe tip contact state shown in FIG. 4B, and the stage is further moved upward by a predetermined overdrive amount and is then stopped. In this case, the Z-drive speed, number of times, and overdrive amount are filed in the file unit 13a as probe mark check parameters. After the probe mark is formed on the dummy wafer as described above, the dummy wafer 12 is moved by the coordinate data XB1 and YB1 stored in the file unit 3a. Since the data XB1 and YB1 are incremental coordinates with respect to the point A, the dummy wafer must coincide with the point A as the beam position as a result of movement. If the moved position of the dummy wafer 12 and the point A do not coincide with each other as a result of probe mark detection, coordinates $\overrightarrow{XDC}$ and $\overrightarrow{YDC}$ are stored as correction amounts in the X- and Y-axis directions.

Furthermore, a $\theta$ offset from an actual probe mark is detected based on the data XB2, YB2, XB3, YB3, . . . , XBn, and YBn. When the offset is detected, the probe card is automatically rotated to correct its position. When $\theta$ correction is performed as described above, the probe mark is formed again, and the above-mentioned operations are repeated until the $\theta$ offset is removed. And correction amount $\overrightarrow{XDC}$, $\overrightarrow{YDC}$ representing a total $\theta$ correction amount from the initial probe mark is then stored. Thereafter, the dummy cassette is stored in the cassette 11.

Figure 4A:
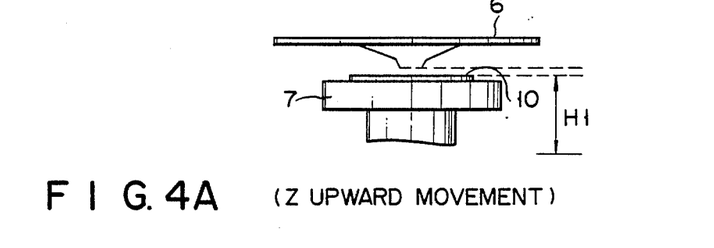
FIGS. 4A, 4B, and 4C are side views of a chuck, for explaining Z-axis control of the present invention.
Figure 4B:
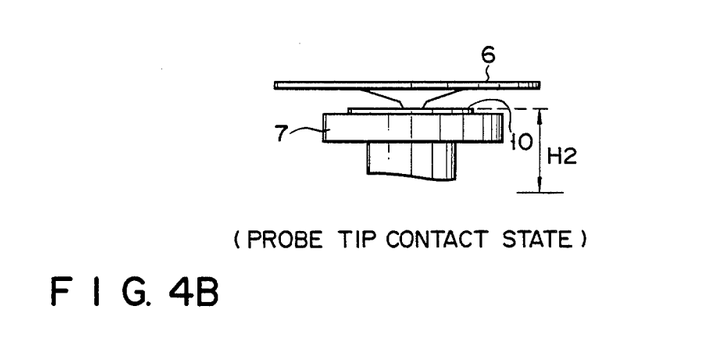
Figure 4C:
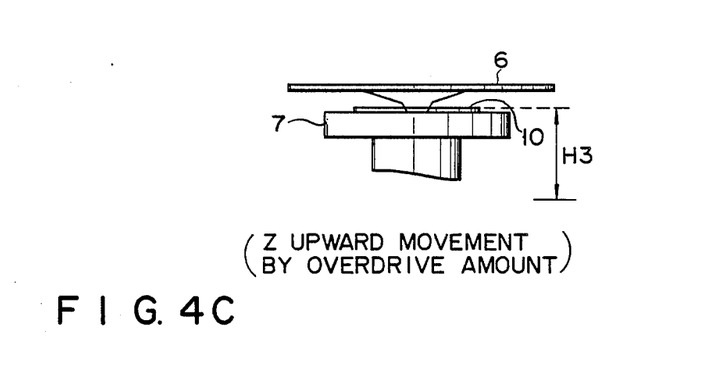
Figure 6:
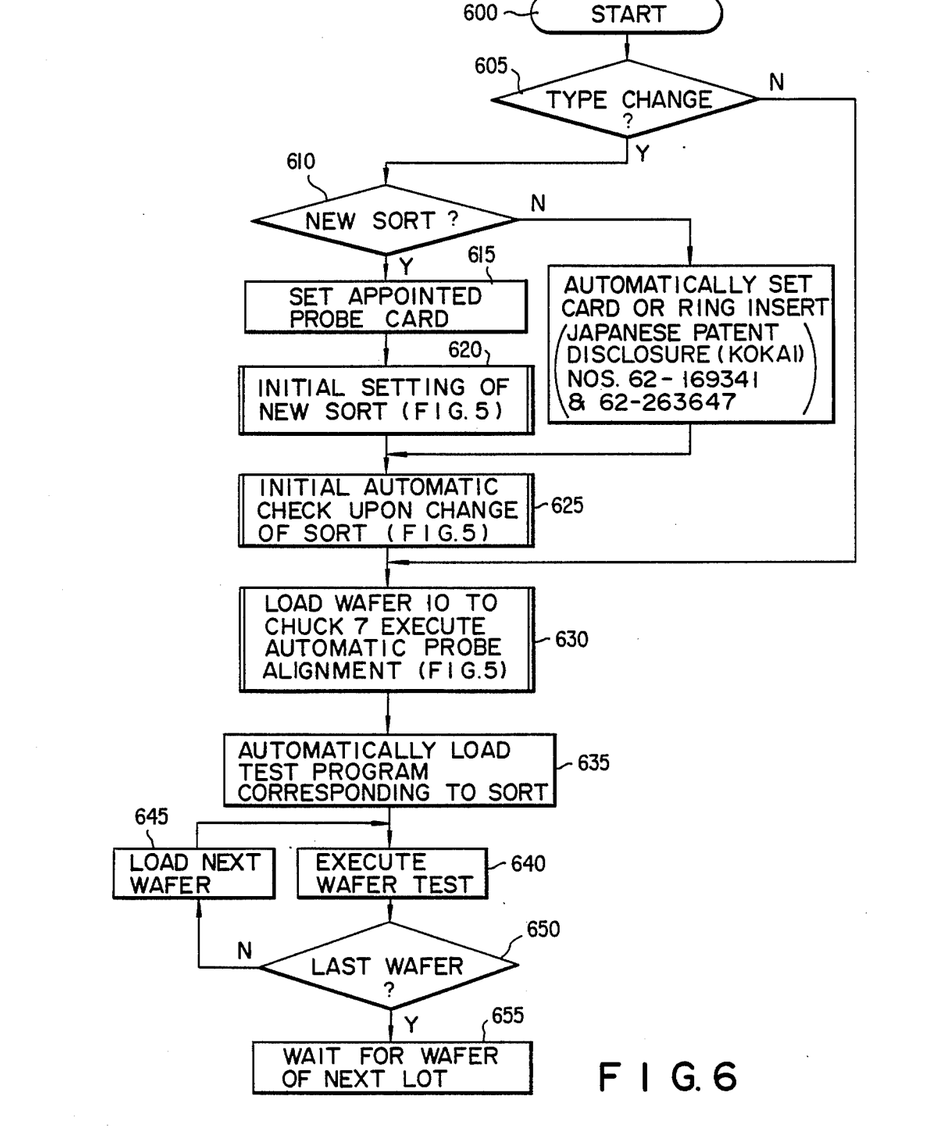
FIG. 6 is a flow chart for explaining an automated selection of probe card and its alignment preformed when the sort of wafer or lot of wafers changes.

The wafer 10 to be actually measured is loaded onto the main chuck top 7 along the route 16. After the $\theta$ alignment, the pad on the wafer can be precisely moved below the corresponding probe of the probe card on the basis of the X- and Y-axes correction amount data and the final $\theta$ correction amount, that is, data $\overrightarrow{XDC}$ and $\overrightarrow{YDC}$. In this case, Z-axis control for the wafer 10 is performed as follows. A contact state is automatically detected in cooperation with a contact check program of the tester on the basis of FIG. 4, and the stage is stopped when the probe tip of the probe card bites into the wafer by the predetermined overdrive amount, e.g., 50 to 60 $\mu$m.

When a new sort of wafer is tested, the data $\overrightarrow{XDB}$, $\overrightarrow{YDB}$, XB1, YB1, . . . , XBn, and YBn corresponding to the sort are filed in the file unit 13a. When the wafer of the filed sort is tested, the dummy wafer 12 is loaded onto the main chuck 7 along the route 19, the probe mark is formed as described above and is checked based on the standard position data XB1 and YB1 of the probe card. If an offset is found, the correction amount data $\overrightarrow{XDC}$ and $\overrightarrow{YDC}$ of the tip position of the probe card are stored. The $\theta$ offset of the probe card 6 is recognized on the basis of the probe tip position data XB1, YB1, . . . , XBn, and YBn of the actual probe card 6, and $\theta$ correction of the probe card 6 is performed. The abovementioned correction is repetitively performed until the $\theta$ offset is removed. When the $\theta$ offset becomes 0, the final position offset data $\overrightarrow{XDC}$, $\overrightarrow{YDC}$ of the probe card 6 are detected. Thereafter, the wafer 10 to be measured can be loaded onto the main chuck top 7, and the probe tip of the probe card 6 can be automatically and precisely brought into contact with the pad on the wafer 10 corresponding to the final data $\overrightarrow{XDC}$, $\overrightarrow{YDC}$. Thereafter, a wafer test is performed, and an unmanned probe operation can then be executed for this sort of wafer.

According to the present invention, the probe tip position of a card is precisely detected using a dummy wafer and detecting the center position of the granity of the probe mark, and $\theta$, X, and Y corrections can be automatically performed. An unmanned system corresponding to a large number of sorts of wafer can be constituted by interlocking with an automatic exchange mechanism of a probe card (Japanese Patent Disclosure (Kokai) Nos. 62-169341 and 62-263647).

According to the present invention, an automatic probe alignment operation can be performed in correspondence with a change in sort of wafer, and an exchange operation of a ring insert having a probe card can be efficiently automated. Thus, the present invention contributes to improvements in the productivity, yield, and quality of the finished product. Thus, a very practical prober can be provided.

What is claimed is:

1. An automatic alignment method for a prober, comprising:
   the step of detecting a height level of a position of a dummy object to be tested to align a position of an object to be tested, and outputting height data;
   the step of moving the dummy object to a measurement unit and contacting the dummy object and a probe tip of a probe each other to form a probe mark on the dummy object to be tested, according with the above height data;
   the step of moving the dummy object to an alignment unit and detecting its positions in the position of X- and Y-axes and a $\theta$ direction offset, and outputting these data;
   the correction step of comparing the data of the probe mark and standard probe tip position and performing X-Y axis correction of the dummy object and $\theta$ correction of the probe tips;
   the check step of moving the dummy object to the measurement unit again to form the probe mark by the probe card, and detecting the probe mark by the alignment unit so as to check if positions of the probe tips of the probe coincide with electrode pad positions of the object;
   the offset correction step of causing the positions of the probe tips of the probe to coincide with the electrode pads of the object if the positions of the probe tips are offset from the electric tips of the object;
   the step of repeating the check step and the offset correction step to correct an offset between the positions of the probe tips of the probe and the electrode pads of the object until the offset becomes 0;
   the step of storing differences between the initial probe tips positions of the probe and the final probe tips positions of the probe card obtained by the repetitive check/offset correction steps, as an amount of correction data; and
   the step of automatically aligning so as to match the electrode pad position on the object and the probe tip position of the probe in accordance with correction data obtained with the dummy wafer.

2. A method according claim 1, wherein the coincidence of positions of the probe tips of the probe with electrode pads position means a coincidence in X-Y axes and $\theta$ offset of the both, and the offset correction step means an automatic amendment in X-Y axes and $\theta$ offset set of the both.

3. A method according to claim 1, wherein the object is a semiconductor wafer.

4. A method according to claim 1, wherein a mechanism for bringing the electrode pads on the object into contact with the probe tip positions of the probe performs automatic control such that after the electric pads on the object are brought into contact with the probe tips of the probe, the electrode pads and the probe tips positions are stopped after they further approach each other.

5. An automatic alignment method for a probe, comprising the steps of:
   performing $\theta$ alignment of a new type of object to be tested, on an alignment portion, bringing a probe tip of a probe card into contact with a pad of said object, and detecting a mark made by said probe tip, thereby to ascertain the position of said probe tip, and designating data related to the ascertained position as standard probe tip position data corresponding to the type of object tested;
   determining the amount of correction between a test position of said object and the position of said probe tip, determining at least two coordinates pertaining to the test position of said object, and determining the coordinates as data representing the position of said probe tip for $\theta$ alignment of the probe card; and
   filing, as data corresponding to the type of the object tested, said standard probe tip position data, said probe tip position correction amount data, said probe tip position data used for performing $\theta$ alignment of said probe card, and necessary parameters associated therewith.

* * * * *

UNITED STATES PATENT AND TRADEMARK OFFICE
CERTIFICATE OF CORRECTION

PATENT NO. : 4,943,767

DATED : JULY 24, 1990

INVENTOR(S) : KEIICHI YOKOTA

It is certified that error appears in the above-identified patent and that said Letters Patent is hereby corrected as shown below:

On the title page:

Priority Data should not be listed. Please delete "Aug. 21, 1986 [JP] Japan .............. 61-193967."

Signed and Sealed this

Twenty-fourth Day of September, 1991

Attest:

HARRY F. MANBECK, JR.

Attesting Officer

Commissioner of Patents and Trademarks